US011444453B2

(12) United States Patent
Moon

(10) Patent No.: US 11,444,453 B2
(45) Date of Patent: Sep. 13, 2022

(54) ELECTROSTATIC DISCHARGE PROTECTION CIRCUIT

(71) Applicant: Dialog Semiconductor Korea Inc., Seongnam-si (KR)

(72) Inventor: Je Cheol Moon, Seongnam-si (KR)

(73) Assignee: Dialog Semiconductor Korea Inc., Seoul (KR)

( * ) Notice: Subject to any disclaimer, the term of this patent is extended or adjusted under 35 U.S.C. 154(b) by 327 days.

(21) Appl. No.: 16/667,937

(22) Filed: Oct. 30, 2019

(65) Prior Publication Data
US 2020/0176979 A1    Jun. 4, 2020

(30) Foreign Application Priority Data
Nov. 29, 2018  (KR) .......................... 10-2018-0150975

(51) Int. Cl.
*H02H 9/04* (2006.01)
(52) U.S. Cl.
CPC ..................... *H02H 9/04* (2013.01)
(58) Field of Classification Search
CPC ................. H02H 9/04; H02H 9/046
See application file for complete search history.

(56) References Cited

U.S. PATENT DOCUMENTS

| 2002/0163768 A1* | 11/2002 | Kwon ................. H01L 27/0255 361/56 |
| 2009/0154036 A1* | 6/2009 | Yen .................... H01L 27/0255 361/56 |
| 2010/0103572 A1 | 4/2010 | Worley |
| 2014/0036892 A1 | 2/2014 | Zhu |
| 2015/0002967 A1* | 1/2015 | Kawase ............ H01L 27/0255 361/56 |

FOREIGN PATENT DOCUMENTS

| KR | 10-0532101 | 11/2005 |
| KR | 10-2011-0089301 | 8/2011 |
| KR | 10-2018-0129613 | 12/2018 |

OTHER PUBLICATIONS

Korean Office Action, Application No. 10-2018-0156262, Applicant: Dialog Semiconductor Korea Inc., Transmittal dated Nov. 16, 2019.
Korean Office Action, Application No. 10-2018-0150975, Applicant: Da/Eo/RoGeu SeMiKeonDeokTeo KoRia dated Jan. 21, 2020, 4 pages.

* cited by examiner

*Primary Examiner* — Nguyen Tran
(74) *Attorney, Agent, or Firm* — Saile Ackerman LLC; Stephen B. Ackerman

(57) ABSTRACT

An ESD protection circuit is provided. An embodiment provides an ESD protection circuit of a crystal oscillator for bearing an output swing level in an ESD IO for improving a reference clock isolation by adding a stacked diode to the ESD protection circuit and for improving a protection function by applying a secondary diode structure.

10 Claims, 5 Drawing Sheets

ELECTROSTATIC DISCHARGE PROTECTION CIRCUIT

RELATED APPLICATION

This application claims the benefit of priority of Korean Patent Application No. 10-2018-0150975 filed on Nov. 29, 2018, the contents of which are incorporated herein by reference in its entirety.

FIELD AND BACKGROUND OF INVENTION

An embodiment relates to an electrostatic discharge (ESD) protection circuit of a crystal oscillator for improving reference clock isolation.

Descriptions illustrated below merely provide background information related to an embodiment of the disclosure and do not compose a conventional art.

Generally, in a manufacturing process using electric and electronic components such as a printed circuit board or semiconductor chips mounted on a printed circuit board, high voltage may be applied to the printed circuit board as an ESD occurs in a moment by being accessed by a user, an adjacent structure, or an object.

If an ESD in high voltage is applied to the electronic components such as a printed circuit board and a semiconductor chip, a micro circuit pattern formed on the printed circuit board is damaged or the semiconductor chip is damaged. If the printed circuit board or semiconductor chip is damaged, the printed circuit board or the semiconductor chip does not work normally. In other words, electrostatic is input on a fine wiring via a pad as the semiconductor chip is integrated, and thus, the semiconductor chip is damaged.

An ESD protection circuit or an ESD protection element prevents the elements provided in an inner circuit of a semiconductor chip from being damaged by the ESD. Generally, the ESD protection circuit is composed of a resistance, a diode, a bipolar junction transistor (BJT), etc.

A general ESD protection circuit is in a form in which a reversed diode is added between VDD, input/output (IO) and a ground (GND), and requires additional VDD. The ESD protection circuit of a general crystal oscillator additionally includes a diode between the VDD and GND. Because of a performance degradation of the ESD protection circuit included in a general crystal oscillator, the input and output performance of the crystal oscillator is degraded.

Generally, in the ESD protection circuit, an input pin (XI) and an output pin (XO) of a crystal oscillator (XTAL) share ESD protection circuit VDD with another block, and thus, generally, the reference clock spuriously generated in the input pin (XI) and the output pin (XO) of the ESD protection circuit is applied to the other block.

Normally, in the ESD protection circuit, a noise of another block passes through VDD and is applied to the input pin (XI) and the output pin (XO), and thus, there is a problem that reference clock phase noise degradation is generated. Accordingly, the ESD protection circuit that can improve the reference clock isolation is needed.

SUMMARY OF INVENTION

The purpose of an embodiment is to provide an ESD protection circuit of a crystal oscillator for bearing an output swing level in an ESD IO to improve a reference clock isolation by adding a stacked diode to the ESD protection circuit ESD and for improving a protection function by applying a secondary diode structure.

According to one side of an embodiment, there is provided an ESD protection circuit including a first rectifier unit including a first stacked diode generated by connecting a plurality of rectifier elements in a form of a stack and a first reversed diode, and connect another end of the first stacked diode and another end of the first reversed diode to a common ground, and a second rectifier unit including a second stacked diode generated by connecting a plurality of rectifier elements in a form of a stack and a second reversed diode, and connect another end of the second stacked diode and another end of the second reversed diode to the common ground, and an electrostatic shock applied to an input and output (IO) port of the first rectifier unit and the second rectifier unit flows to a discharge path according to an operation mode and the electrostatic shock is discharged to the common ground.

According to an embodiment, there is an effect of bearing an output swing level in an ESD IO to improve a reference clock isolation by adding a stacked diode to an ESD protection circuit and improving a protection function by applying a secondary diode structure.

According to an embodiment, there is an effect of reducing a surface of an ESD protection circuit because it is not required to additionally apply VDD ESD-Ring such as a general ESD protection circuit. In addition, according to an embodiment, there is an effect of restraining the abandonment of a clock spurious into an ESD protection circuit and the inflow of a noise into a clock.

DETAILED DESCRIPTION OF PREFERRED EMBODIMENTS

Hereinafter an embodiment will be provided in detail with reference to attached drawings.

Figure 1:
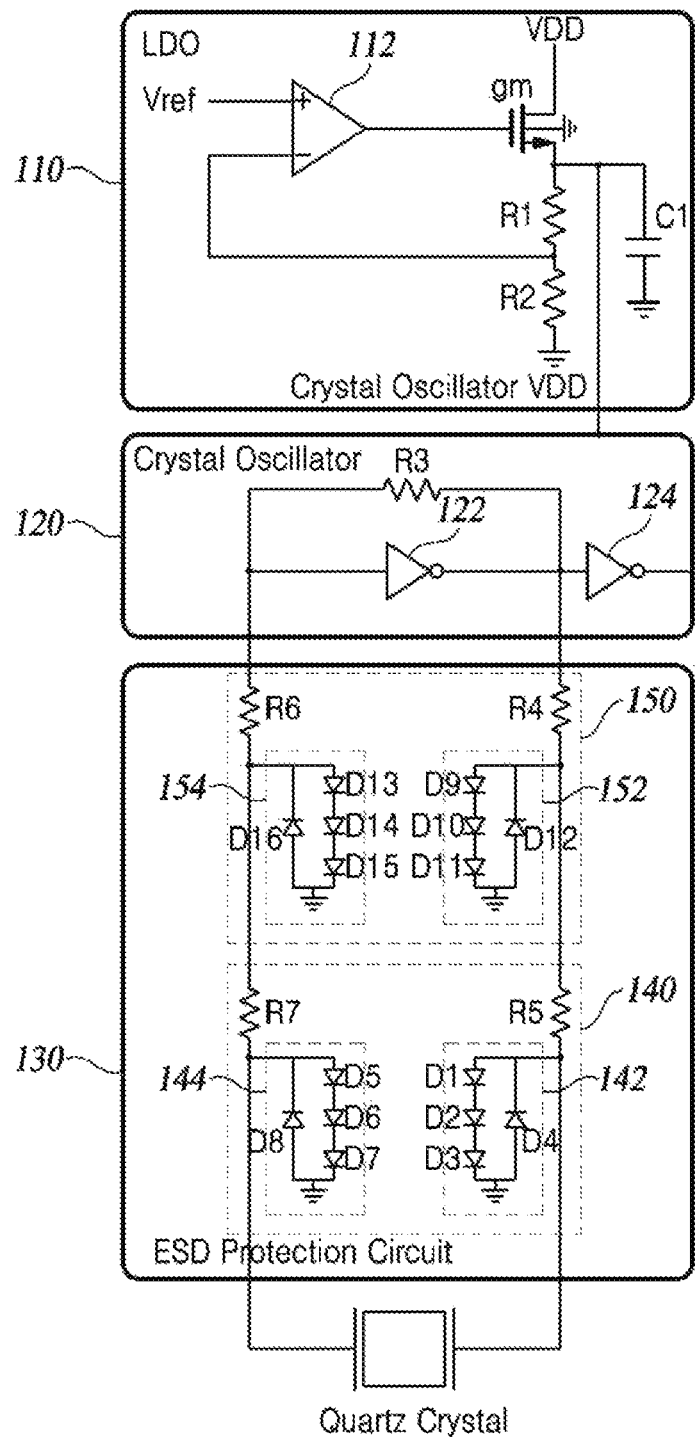
FIG. 1 is a circuit diagram illustrating an ESD protection circuit according to an embodiment of the disclosure.

FIG. 1 is a circuit diagram illustrating an ESD protection circuit according to an embodiment of the disclosure.

When the LDO 110, a crystal oscillator 120, the ESD protection circuit 130 are implemented as a single chip, the blocks having a common ground or having a correlation regarding the ESD protection are bound up by being shared by VDD and a ground.

The LDO 110 means a linear regulator that operates also in a low input and output potential difference. It is preferred that the ESD protection circuit 130 according to an embodiment is applied to the structure using the LDO 110. The LDO 110 may be applied to a power switch in an NMOS LDO type and performs the role of a power clamp. The LDO 110 may be applied to a power switch in a PMOS LDO type and performs the role of the power clamp.

The LDO 110 includes a comparator 112, an amplifier (gm), a first resistance (R1), a second resistance (R2), and a first capacitor (C1).

One end on an input side of the comparator 112 is connected to a standard voltage input terminal, and another end on the input side of the comparator 112 is connected to a contact of the first resistance (R1) and the second resistance (R2). A first current inlet terminal is connected to VDD, a first input end of the amplifier (gm) is connected to an output end of the comparator 112, and a first current outlet terminal of the amplifier (gm) is connected to a contact of the first resistance (R1) and the first capacitor (C1). One end of the first resistance (R1) is connected to one end of the first capacitor (C1). Another end of the first resistance (R1) is connected to one end of the second resistance (R2). Another end of the second resistance (R2) is connected to a common ground. The contact of the first resistance (R1) and the first capacitor (C1) is connected to an output of the LDO 110 which is a power terminal of the crystal oscillator 120.

The crystal oscillator 120 includes a third resistance (R3), a first inverter (logic gate) 122, and a second inverter (logic gate) 124.

One end of the third resistance (R3) is connected to a contact of the output terminal of the first inverter (logic gate) 122, the input terminal of the second inverter (logic gate) 124, and one end of the fourth resistance (R4). The other end of the third resistance (R3) is connected to a contact of the input terminal of the first inverter (logic gate) 122 and one end of the sixth resistance (R6).

The input terminal of the first inverter (logic gate) 122 is connected to a contact of the other end of the third resistance (R3) and one end of the sixth resistance (R6). The output terminal of the first inverter (logic gate) 122 is connected to the contact of the input terminal of the second inverter (logic gate) 124, one end of the third resistance (R3), and one end of the fourth resistance (R4).

The input terminal of the second inverter (logic gate) 124 is connected to the contact of one end of the third resistance (R3), the output terminal of the first inverter (logic gate) 122, and one end of the fourth resistance (R4). The output terminal of the second inverter (logic gate) 124 is connected to a clock source used in various kinds of blocks by an output of the crystal oscillator 120.

The ESD protection circuit 130 according to an embodiment includes a first rectifier unit 142, a second rectifier unit 144, a third rectifier unit 152, and a fourth rectifier unit 154. The first rectifier unit 142, the second rectifier unit 144, the third rectifier unit 152, and the fourth rectifier unit 154 include a stacked diode unit generated by applying a stacked type to a forward diode and a backward diode. The ESD protection circuit 130 according to an embodiment does not use VDD.

In other words, the ESD protection circuit 130 according to an embodiment includes a stacked diode for bearing an output swing level in the IO of the ESD protection circuit 130. The ESD protection circuit 130 uses the secondary diode structure for improving a protection function.

The ESD protection circuit 130 includes a first stage ESD protection circuit 140 and a second stage ESD protection circuit 150.

The second stage ESD protection circuit 150 includes a fourth resistance (R4), a sixth resistance (R6), a third rectifier unit 152, and a fourth rectifier unit 154.

One end of the fourth resistance (R4) is connected to the contact of the output terminal of the first inverter (logic gate) 122, an input terminal of the second inverter (logic gate), and one end of the third resistance (R3). Another end of the fourth resistance (R4) is connected to one end of the third rectifier unit 152. Another end of the third rectifier unit 152 is connected to a common ground.

The third rectifier unit 152 includes a third stacked diode generated by connecting a plurality of rectifier units (D9, D10, and D11) in a stacked form, and a third reversed diode (D12), and connects another end of the third stacked diode (D9, D10, and D11) and another end of the third reversed diode (D12) to the common ground.

The third rectifier unit 152 includes a ninth diode (D9), a tenth diode (D10), an eleventh diode (D11), and a twelfth diode (D12).

A contact of an anode of the ninth diode (D9) and a cathode of the twelfth diode (D12) is connected to a contact of another end of the fourth resistance and one end of the fifth resistance. A cathode of the ninth diode (D9) is connected to an anode of the tenth diode (D10), a cathode of the tenth diode (D10) is connected to an anode of the eleventh diode (D11). A contact of a cathode of the eleventh diode (D11) and an anode of the twelfth diode (D12) is connected to the common ground.

One end of the sixth resistance (R6) is connected to a contact of the input terminal of the first inverter (logic gate) 122 and another end of the third resistance. Another end of the sixth resistance (R6) is connected to one end of the fourth rectifier unit 154. Another end of the fourth rectifier unit 154 is connected to the common ground.

The fourth rectifier unit 154 includes a fourth stacked diode generated by connecting a plurality of rectifier units (D13, D14, and D15) in a stacked form, and a fourth reversed diode (D16), and connects another end of the fourth stacked diode (D13, D14, and D15) and another end of the fourth reversed diode (D16) to the common ground.

The fourth rectifier unit 154 includes a thirteenth diode D13, a fourteenth diode D14, a fifteenth diode D15, and a sixteenth diode D16.

A contact of an anode of the thirteenth diode (D13) and a cathode of the sixteenth diode (D16) is connected to a contact of another end of the sixth resistance (R6) and one end of the seventh resistance (R7). A cathode of the thirteenth diode (D13) is connected to an anode of the fourteenth diode (D14), a cathode of the fourteenth diode (D14) is connected to an anode of the fifteenth diode (D15). A contact of a cathode of the fifteenth diode (D15) and an anode of the sixteenth diode (D16) is connected to the common ground.

The first stage ESD protection circuit 140 includes a fifth resistance (R5), a seventh resistance (R7), a first rectifier unit 142, and a second rectifier unit 144.

One end of the fifth resistance (R5) is connected to a contact of another end of the fourth resistance (R4) and one end of the third rectifier 152. Another end of the fifth resistance (R5) is connected to one end of a quartz crystal. One end of the first rectifier unit 142 is connected to a contact of another end of the fifth resistance R5 and one end of the quartz crystal. Another end of the first rectifier unit 142 is connected to the common ground.

The first rectifier unit 142 includes a first stacked diode generated by connecting a plurality of rectifier units (D1, D2, and D3) in a stacked form, and a first reversed diode (D4), and connects another end of the first stacked diode (D1, D2, and D3) and another end of the first reversed diode (D4) to the common ground.

The first rectifier unit 142 includes the first diode (D1), the second diode (D2), the third diode (D3), and the fourth diode (D4).

A contact of an anode of the first diode (D1) and a cathode of the fourth diode (D4) is connected to a contact of another end of the fifth resistance and one end of the quartz crystal. A cathode of the first diode (D1) is connected to an anode of the second diode (D2), a cathode of the second diode (D2) is connected to an anode of the third diode (D3). A contact of a cathode of the third diode (D3) and an anode of the fourth diode (D4) is connected to the common ground.

One end of the seventh resistance (R7) is connected to a contact of another end of the sixth resistance (R6) and one end of the fourth rectifier 154. Another end of the seventh resistance (R7) is connected to one end of the second rectifier unit 144. Another end of the second rectifier unit 144 is connected to the common ground.

The second rectifier unit 144 includes a second stacked diode generated by connecting a plurality of rectifiers (D5, D6, and D7) in a stacked form, and a second reversed diode (D8), and connects another end of the second stacked diode (D5, D6, and D7) and another end of the second reversed diode (D8) to the common ground.

The second rectifier unit 144 includes a fifth diode (D5), a sixth diode (D6), a seventh diode (D7), and an eighth diode (D8).

A contact of an anode of the fifth diode (D5) and a cathode of the eighth diode (D8) is connected to a contact of another end of the seventh resistance and another end of the quartz crystal. A cathode of the fifth diode (D5) is connected to an anode of the sixth diode (D6), a cathode of the sixth diode (D6) is connected to an anode of the seventh diode (D7). A contact of a cathode of the seventh diode (D7) and an anode of the eighth diode (D8) is connected to the common ground.

Figure 2:
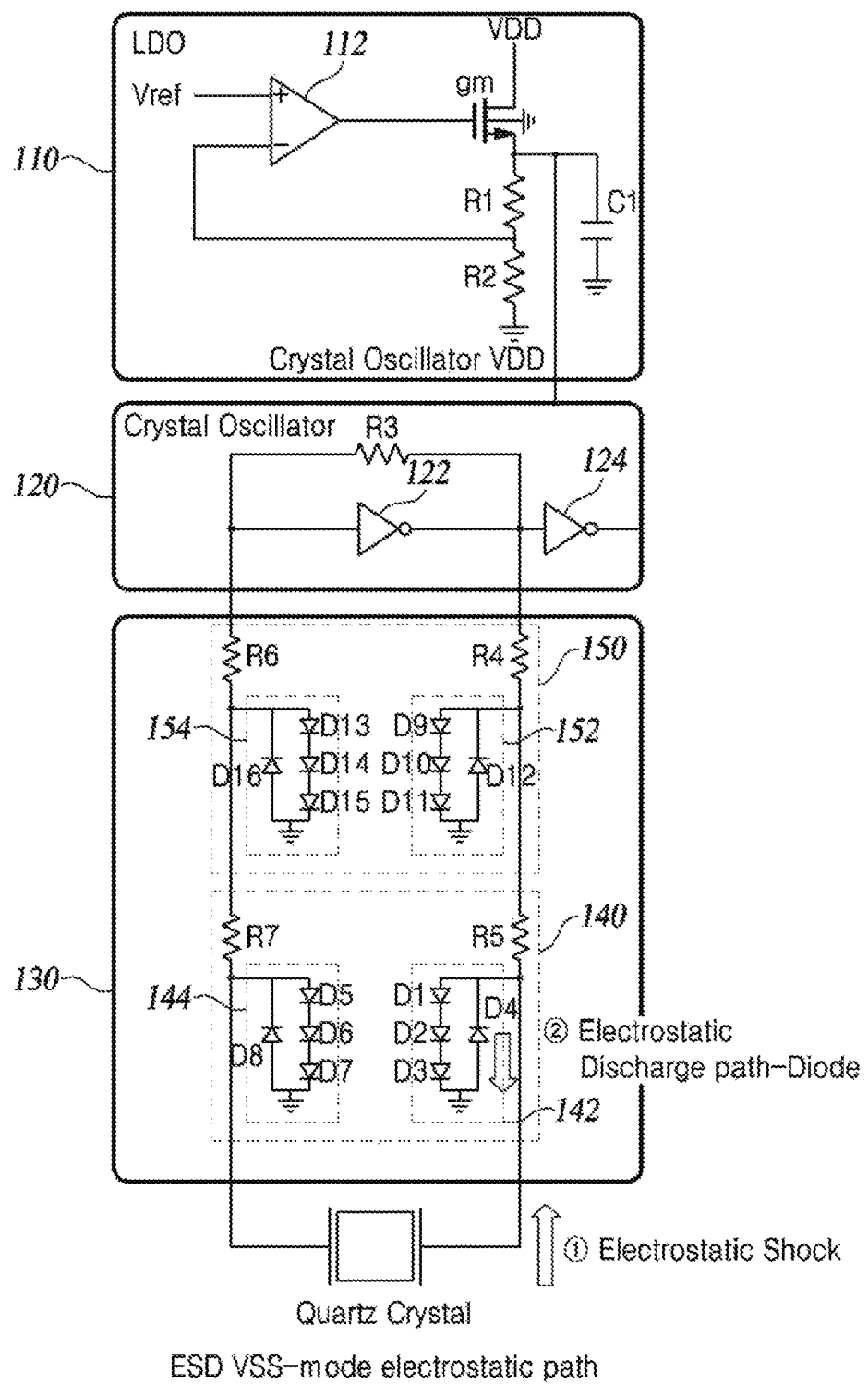
FIG. 2 is a view illustrating a method that an ESD protection circuit operates in an ESD VSS mode according to an embodiment of the disclosure.

FIG. 2 is a view illustrating a method that an ESD protection circuit operates in an ESD VSS mode according to an embodiment of the disclosure.

In FIG. 2, the case in which the ESD protection circuit 130 operates in an ESD VSS (+) mode will be illustrated. Electrostatic shock is applied to an IO port of the ESD protection circuit 130 in a direction of arrow ① illustrated in FIG. 2.

The electrostatic shock flows to the common ground via the fourth diode (D4) which is in a direction of arrow ② illustrated in FIG. 2 of the first rectifier unit 142 in the first stage ESD protection circuit 140.

If the ESD protection circuit 130 operates in an ESD VSS (−) mode, the electrostatic shock is applied in a direction opposite to the arrow illustrated in FIG. 2. The electrostatic shock is applied to the IO port of the ESD protection circuit 130 in a direction opposite to the arrow ① illustrated in FIG. 2.

The electrostatic shock flows to the common ground via the eighth diode (D8) of the second rectifier unit 144 in the first stage ESD protection circuit 140.

Figure 3:
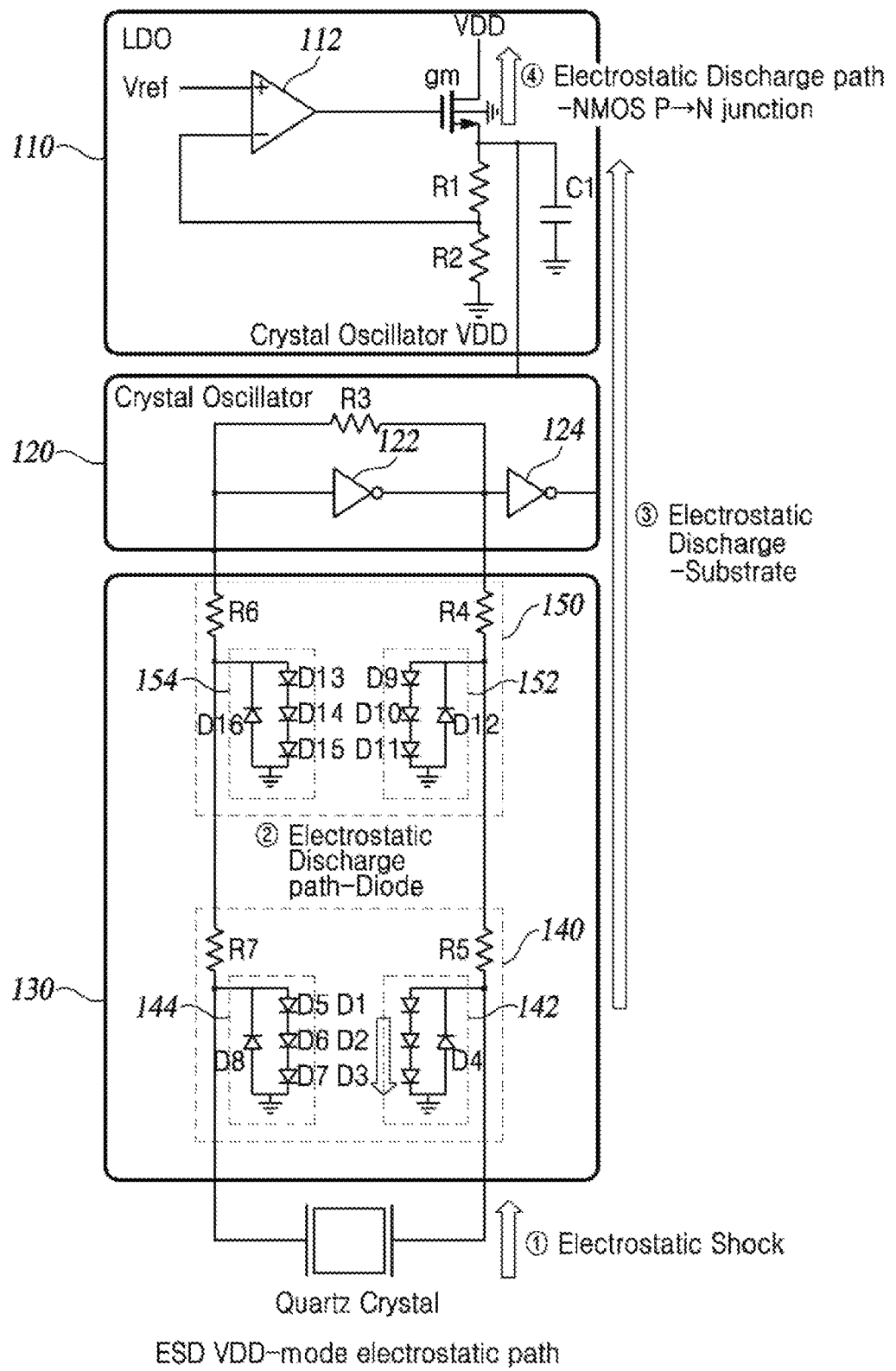
FIG. 3 is a view illustrating a method that an ESD protection circuit operates in an ESD VDD mode according to an embodiment of the disclosure.

FIG. 3 is a view illustrating a method that an ESD protection circuit operates in an ESD VDD mode according to an embodiment of the disclosure.

In FIG. 3, the case in which the ESD protection circuit 130 operates in an ESD VDD (+) mode will be illustrated. Electrostatic shock is applied to the IO port of the ESD protection circuit 130 in a direction of arrow ① illustrated in FIG. 3.

The electrostatic shock flows to the common ground via the first diode (D1), the second diode (D2), and the third diode (D3) which are stacked diodes in a direction of arrow ② illustrated in FIG. 3 of the first rectifier unit 142 in the first stage ESD protection circuit 140.

Thereafter the electrostatic shock flows to the LDO 110 along with the direction of arrow ③ illustrated in FIG. 3. In other words, the electrostatic shock applied to the IO port is applied to the LDO 110 along with the electrostatic discharge path of the common substrate.

Thereafter the electrostatic shock flows to VDD in the LDO 110 along with the direction of arrow ④ illustrated in FIG. 3. In other words, the electrostatic shock applied to the LDO 110 flows to VDD via PN-junction of a power transistor of the LDO NMOS.

If the ESD protection circuit 130 operates in an ESD VDD (−) mode, the electrostatic shock is applied in a direction opposite to the arrow illustrated in FIG. 3. The electrostatic shock is applied to the IO port of the ESD protection circuit 130 in a direction opposite to arrow ① illustrated in FIG. 3.

The electrostatic shock flows to the common ground via the fifth diode (D5), the sixth diode (D6), and the seventh diode (D7) which are stacked diodes illustrated in FIG. 3 of the second rectifier unit 144 in the first stage ESD protection circuit 140.

Thereafter, the electrostatic shock is applied to the LDO 110 along with the ESD path of the substrate, and flows to VDD in the LDO 110. In other words, the electrostatic shock applied to the LDO 110 flows to VDD via PN-junction of a power transistor of the LDO NMOS.

Figure 4:
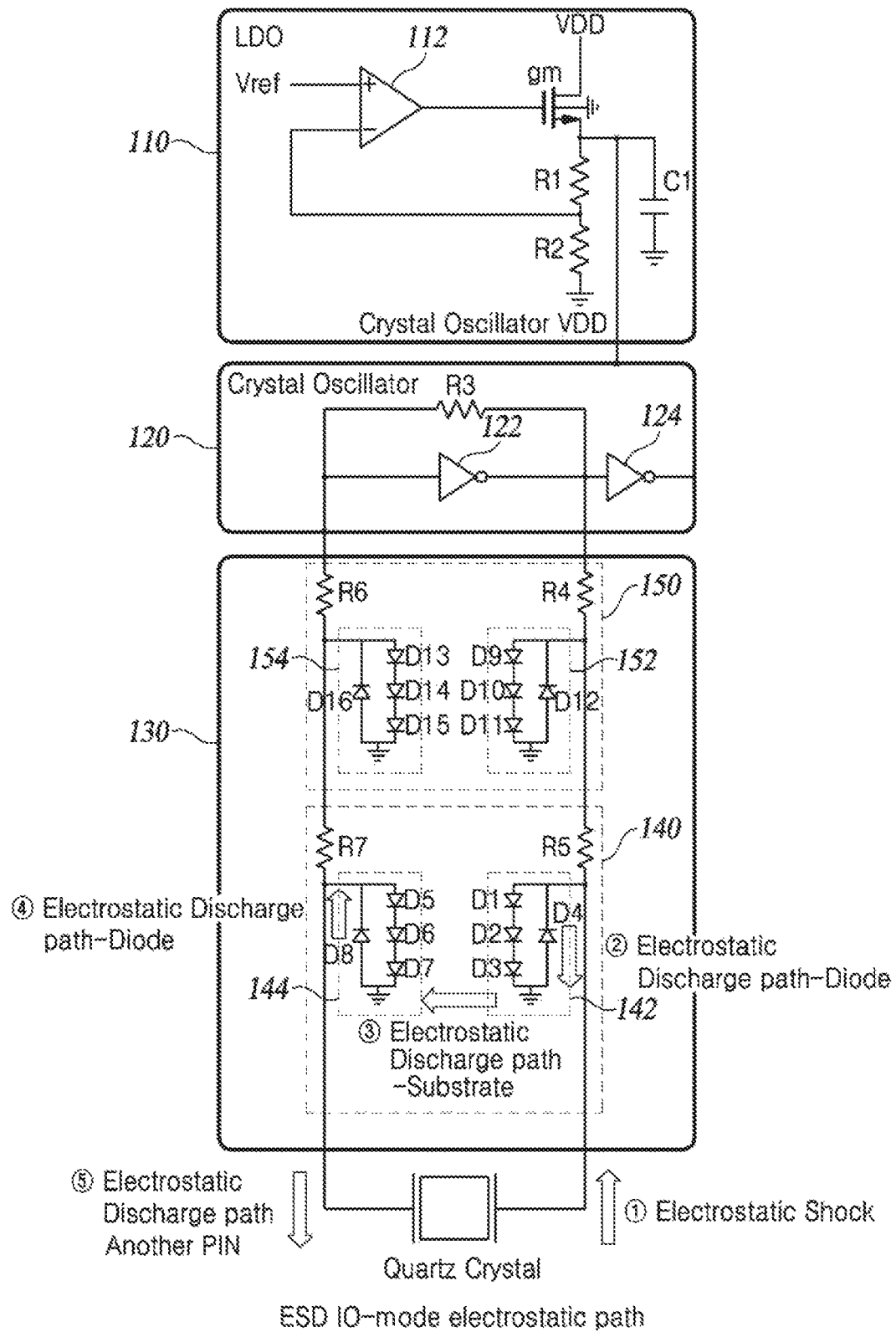
FIG. 4 is a view illustrating a method that an ESD protection circuit operates in an ESD IO mode according to an embodiment of the disclosure.

FIG. 4 is a view illustrating a method that an ESD protection circuit operates in an ESD IO mode according to an embodiment of the disclosure.

In FIG. 4, the case in which the ESD protection circuit 130 operates in an ESD IO (+) mode will be described. Electrostatic shock is applied to the IO port of the ESD protection circuit 130 in a direction of arrow ① illustrated in FIG. 4.

The electrostatic shock flows to the common ground via the fourth diode (D4) which is in a direction of arrow ② illustrated in FIG. 4 of the first rectifier unit 142 in the first stage ESD protection circuit 140.

The electrostatic shock is applied to the second rectifier unit 144 along with the ESD path of the common substrate of the first stage ESD protection circuit 140 which is in a direction of arrow ③ illustrated in FIG. 4.

The electrostatic shock flows along with the ESD path of the eighth diode (D8) of the second rectifier unit 144 in the first stage ESD protection circuit 140 which is in a direction of arrow ④ illustrated in FIG. 4.

The electrostatic shock flows along with the ESD path of another PIN which is in a direction of arrow ⑤ illustrated in FIG. 4. In other words, the electrostatic shock flows to the IO via another IO PIN.

If the ESD protection circuit 130 operates in an ESD IO (−) mode, the electrostatic shock is applied in a direction opposite to the direction of the arrow illustrated in FIG. 4. The electrostatic shock is applied to the IO port of the ESD protection circuit 130 in a direction opposite to arrow ① illustrated in FIG. 4.

The electrostatic shock flows to the common ground via the eighth diode D8 of the second rectifier unit 144 in the first stage ESD protection circuit 140.

The electrostatic shock is applied to the first rectifier unit 142 along with the ESD path of the common substrate of the first stage ESD protection circuit 140.

The electrostatic shock flows along with the ESD path of the fourth diode (D4) of the first rectifier unit 142 in the first stage ESD protection circuit 140.

The electrostatic shock flows along with the ESD path of another PIN. In other words, the electrostatic shock flows to the IO via another IO PIN forward.

Figure 5:
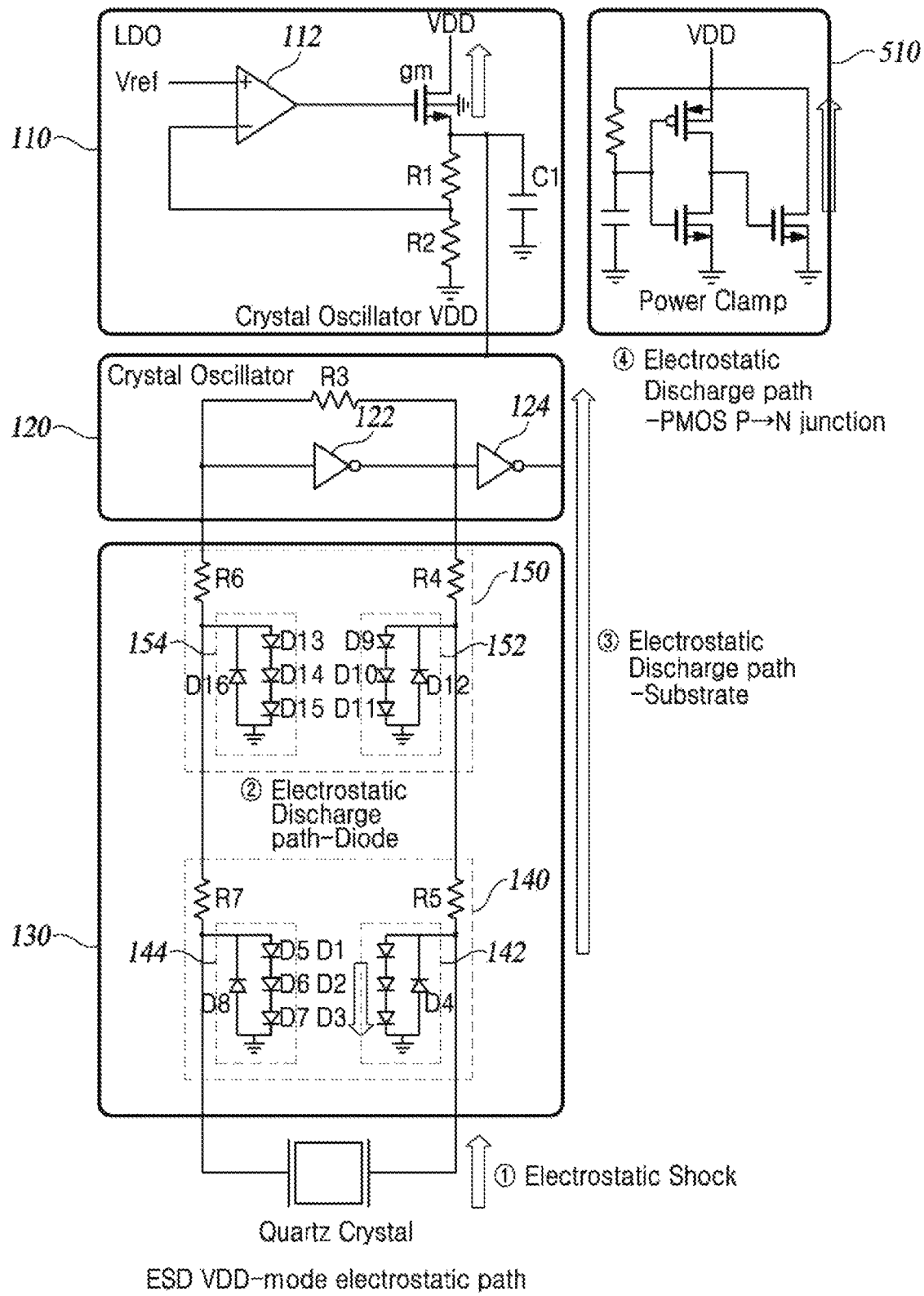
FIG. 5 is a view illustrating a method that an ESD protection circuit operates in an ESD VDD mode in a p-channel metal-oxide-semiconductor (PMOS) Low-Dropout (LDO) type according to an embodiment of the disclosure.

FIG. 5 is a view illustrating a method that an ESD protection circuit operates in an ESD VDD mode in PMOS LDO type according to an embodiment of the disclosure.

In FIG. 5, the case in which the ESD protection circuit 130 operates in an ESD VDD (+) mode will be illustrated. Electrostatic shock is applied to the IO port of the ESD protection circuit 130 in a direction of arrow ① illustrated in FIG. 5.

The electrostatic shock flows to the common ground via the first diode (D1), the second diode (D2), and the third diode (D3) which are in a direction of arrow ② illustrated in FIG. 5 of the first rectifier unit 142 in the first stage ESD protection circuit 140.

Thereafter the electrostatic shock flows to the PMOS LDO 510 along with the direction of arrow ③ illustrated in FIG. 5. In other words, the electrostatic shock applied to the IO port applies to the PMOS LDO 510 along with the electrostatic discharge path of the common substrate.

Thereafter the electrostatic shock flows to VDD in the PMOS LDO 510 along with the direction of arrow ④ illustrated in FIG. 5. In other words, the electrostatic shock applied to the PMOS LDO 510 flows to VDD via PN-junction of a power transistor.

If the ESD protection circuit 130 operates in an ESD VDD (−) mode, the electrostatic shock is applied in a direction opposite to the arrow illustrated in FIG. 5. Electrostatic shock is applied to the IO port of the ESD protection circuit 130 in a direction opposite to the arrow ① illustrated in FIG. 5.

The electrostatic shock flows to the common ground via the fifth diode (D5), the sixth diode (D6), and the seventh diode (D7) which are stacked diodes illustrated in FIG. 5 of the second rectifier unit 144 in the first stage ESD protection circuit 140.

Thereafter, the electrostatic shock is applied to the PMOS LDO 510 along with the ESD path of the common substrate, and flows to VDD in the PMOS LDO 510. In other words, the electrostatic shock applied to the LDO 110 flows to VDD via PN-junction of a power transistor.

Although example embodiments of the disclosure have been illustrated and described, it should be understood that the disclosure is not limited to the disclosed embodiments and may be variously changed without departing from the spirit and the scope of the disclosure. Accordingly, example embodiments are provided to describe the technical idea, not to limit the technical idea, and the scope of technical idea of the disclosure is not limited by the example embodiments. The scope of the embodiments should be interpreted based on the claims below and all technical ideas in the same scope therewith would be interpreted to be within the scope of rights of the example embodiment of the disclosure.

What is claimed is:

1. An electrostatic discharge (ESD) protection circuit comprising:
   a first rectifier unit including a first stacked diode generated by connecting a plurality of rectifier elements in a form of a stack and a first reversed diode, and configured to connect another end of the first stacked diode and another end of the first reversed diode to a common ground;
   a second rectifier unit including a second stacked diode generated by connecting a plurality of rectifier elements in a form of a stack and a second reversed diode, and configured to connect another end of the second stacked diode and another end of the second reversed diode to the common ground,
   a second stage ESD protection circuit including a fourth resistance (R4) connected to one side of a crystal oscillator, a third rectifier unit connected to the fourth resistance (R4), a sixth resistance (R6) connected to another side of the crystal oscillator, and a fourth rectifier unit connected to the sixth resistance (R6); and
   a first stage ESD protection circuit including a fifth resistance (R5) connected to a contact of the fourth resistance (R4) and the third rectifier unit, the first rectifier unit connected to the fifth resistance (R5), a seventh resistance (R7) connected to a contact of the sixth resistance (R6) and the fourth rectifier unit, and the second rectifier unit connected to the seventh resistance (R7),
   wherein an electrostatic shock applied to an input and output (IO) port of the first rectifier unit and the second rectifier unit flows to a discharge path according to an operation mode and the electrostatic shock is discharged to the common ground.

2. The ESD protection circuit as claimed in claim 1, wherein one end of the fifth resistance (R5) is connected to a contact of another end of the fourth resistance (R4) and one end of the third rectifier unit, and another end of the fifth resistance (R5) is connected to one end of a quartz crystal, and
   wherein one end of the first rectifier unit is connected to a contact of another end of the fifth resistance (R5) and one end of the quartz crystal, and the other end of the first rectifier unit is connected to the common ground.

3. The ESD protection circuit as claimed in claim 1, wherein the first rectifier unit includes a first diode (D1), a second diode (D2), a third diode (D3), and a fourth diode (D4),
   wherein a contact of an anode of the first diode (D1) and a cathode of the fourth diode (D4) is connected to a contact of another end of the fifth resistance and one end of the quartz crystal, and
   wherein a cathode of the first diode (D1) is connected to an anode of the second diode (D2), a cathode of the second diode (D2) is connected to an anode of the third diode (D3), and a contact of a cathode of the third diode (D3) and an anode of the fourth diode (D4) is connected to the common ground.

4. The ESD protection circuit as claimed in claim 1, wherein one end of the seventh resistance (R7) is connected to a contact of another end of the sixth resistance (R6) and one end of the fourth rectifier unit, and another end of the seventh resistance (R7) is connected to one end of the second rectifier unit, and the other end of the second rectifier unit is connected to the common ground, and
   wherein one end of the second rectifier unit is connected to a contact of another end of the seventh resistance (R7) and another end of the quartz crystal, and another end of second rectifier unit is connected to the common ground.

5. The ESD protection circuit as claimed in claim 3, wherein the second rectifier unit includes a fifth diode (D5), a sixth diode (D6), a seventh diode (D7), and an eighth diode (D8),
   wherein a contact of an anode of the fifth diode (D5) and a cathode of the eighth diode (D8) is connected to a contact of another end of the seventh resistance and another end of the quartz crystal, and
   wherein a cathode of the fifth diode (D5) is connected to an anode of the sixth diode (D6), a cathode of the sixth diode (D6) is connected to an anode of the seventh diode (D7), and a contact of a cathode of the seventh diode (D7) and an anode of the eighth diode (D8) is connected to the common ground.

6. The ESD protection circuit as claimed in claim 5, wherein based on an electrostatic shock being applied to the IO port in an ESD VSS (+) mode, the electrostatic shock is discharged to the common ground via the fourth diode (D4) of the first rectifier unit in the first stage ESD protection circuit, and wherein based on an electrostatic shock being applied to the IO port in an ESD VSS (−) mode, the electrostatic shock is discharged to the common ground via the eighth diode (D8) of the second rectifier unit in the first stage ESD protection circuit.

7. The ESD protection circuit as claimed in claim 5, wherein based on an electrostatic shock being applied to the IO port in an ESD VDD (+) mode, the electrostatic shock is discharged to the common ground via the first diode (D1), the second diode (D2), and the third diode (D3) of the first rectifier unit in the first stage ESD protection circuit, and based on the electrostatic shock being applied to N-channel metal oxide semiconductor (NMOS) Low-Dropout (LDO) along with a discharge path of a common substrate, the electrostatic shock is discharged to a VDD in the NMOS LDO, and wherein based on an electrostatic shock being applied to the IO port in an ESD VDD (−) mode, the electrostatic shock is discharged to the common ground via the fifth diode (D5), the sixth diode (D6), and the seventh diode (D7) of the second rectifier unit in the first stage ESD protection circuit, and based on the electrostatic shock being applied to the NMOS LDO along with the discharge path of the common substrate, the electrostatic shock is discharged to the VDD in the NMOS LDO.

8. The ESD protection circuit as claimed in claim 5, wherein based on an electrostatic shock being applied to the IO port in an ESD IO (+) mode, the electrostatic shock flows to the common ground via the fourth diode (D4) of the first rectifier unit in the first stage ESD protection circuit, the electrostatic shock is applied to the second rectifier unit 144 along with a discharge path of a common substrate of the first stage ESD protection circuit, the electrostatic shock flows along with a discharge path of the eighth diode (D8) in the second rectifier unit in the first stage ESD protection circuit, and the electrostatic shock is discharged along with a discharge path of another PIN.

9. The ESD protection circuit as claimed in claim 5, wherein based on an electrostatic shock being applied to the IO port in an ESD IO (−) mode, the electrostatic shock flows to the common ground via the eighth diode (D8) of the second rectifier unit in the first stage ESD protection circuit, based on the electrostatic shock being applied to the first rectifier unit along with a discharge path of a common substrate of the first stage ESD protection circuit, the electrostatic shock flows along with a discharge path of the fourth diode (D4) in the first rectifier unit in the first stage ESD protection circuit, and the electrostatic shock is discharged in a discharge path of another PIN.

10. The ESD protection circuit as claimed in claim 5, wherein based on an electrostatic shock being applied to the IO port in an ESD VDD (+) mode, the electrostatic shock is discharged to the common ground via the first diode (D1), the second diode (D2), and the third diode (D3) of the first rectifier unit in the first stage ESD protection circuit, and based on the electrostatic shock being applied to PMOS LDO along with a discharge path of a common substrate, the electrostatic shock is discharged to VDD in the PMOS LDO, and wherein based on an electrostatic shock being applied to the IO port in an ESD VDD (−) mode, the electrostatic shock is discharged to the common ground via the fifth diode (D5), the sixth diode (D6), and the seventh diode (D7) of the second rectifier unit in the first stage ESD protection circuit, and based on the electrostatic shock being applied to the PMOS LDO along with the discharge path of the common substrate, the electrostatic shock is discharged to the VDD in the PMOS LDO.

* * * * *